US012802741B2

(12) United States Patent
Song et al.

(10) Patent No.: US 12,802,741 B2
(45) Date of Patent: Nov. 17, 2026

(54) MEMORY MODULE, MEMORY DEVICE AND MEMORY SYSTEM FOR COUNTING NUMBER OF ROW ACCESSES

(71) Applicant: SK hynix Inc., Gyeonggi-do (KR)

(72) Inventors: Young Ook Song, Gyeonggi-do (KR); Jae Geun Yun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 420 days.

(21) Appl. No.: 18/451,112

(22) Filed: Aug. 17, 2023

(65) Prior Publication Data

US 2024/0331758 A1 Oct. 3, 2024

(30) Foreign Application Priority Data

Mar. 28, 2023 (KR) ........................ 10-2023-0040147

(51) Int. Cl.

| | |
|---|---|
| ***G11C 11/408*** | (2006.01) |
| ***G06F 7/501*** | (2006.01) |
| ***G11C 11/406*** | (2006.01) |

(52) U.S. Cl.
CPC ............ *G11C 11/408* (2013.01); *G06F 7/501* (2013.01); *G11C 11/406* (2013.01)

(58) Field of Classification Search
CPC ............................ G11C 11/408; G11C 11/406
USPC .................................... 365/236, 230.08, 222
See application file for complete search history.

(56) References Cited

U.S. PATENT DOCUMENTS

| | | | | |
|---|---|---|---|---|
| 2017/0117033 A1* | 4/2017 | Doo | G11C 11/40626 | |
| 2021/0343324 A1 | 11/2021 | Brown et al. | | |
| 2022/0121398 A1* | 4/2022 | Nale | G06F 3/0604 | |
| 2023/0185460 A1* | 6/2023 | Kim | G11C 11/40622 | 711/105 |

FOREIGN PATENT DOCUMENTS

KR 10-2020-0032297 A 3/2020

* cited by examiner

*Primary Examiner* — Connie C Yoha
(74) *Attorney, Agent, or Firm* — IP&T GROUP LLP

(57) ABSTRACT

A memory module includes a plurality of memory devices each including a plurality of rows; and a plurality of row counters each configured to count a number of accesses to a corresponding row among the plurality of rows, and each configured to be distributed and disposed in the plurality of memory devices.

8 Claims, 9 Drawing Sheets

FIG. 7

| number of ACT for R1 | 100A | | 100B | | 100C | | 100D | |
|---|---|---|---|---|---|---|---|---|
| | CNT_R1<1:0> | COUT | CNT_R1<1:0> | COUT | CNT_R1<1:0> | COUT | CNT_R1<1:0> | COUT |
| 1 | 01 | 0 | 00 | 0 | 00 | 0 | 00 | 0 |
| 2 | 10 | 0 | 00 | 0 | 00 | 0 | 00 | 0 |
| 3 | 11 | 0 | 00 | 0 | 00 | 0 | 00 | 0 |
| 4 | 00 | 1 | 01 | 0 | 00 | 0 | 00 | 0 |
| 5 | 01 | 0 | 01 | 0 | 00 | 0 | 00 | 0 |
| 6 | 10 | 0 | 01 | 0 | 00 | 0 | 00 | 0 |
| 7 | 11 | 0 | 01 | 0 | 00 | 0 | 00 | 0 |
| 8 | 00 | 1 | 10 | 0 | 00 | 0 | 00 | 0 |
| 9 | 01 | 0 | 10 | 0 | 00 | 0 | 00 | 0 |
| 10 | 10 | 0 | 10 | 0 | 00 | 0 | 00 | 0 |
| 11 | 11 | 0 | 10 | 0 | 00 | 0 | 00 | 0 |
| 12 | 00 | 1 | 11 | 0 | 00 | 0 | 00 | 0 |
| 13 | 01 | 0 | 11 | 0 | 00 | 0 | 00 | 0 |
| 14 | 10 | 0 | 11 | 0 | 00 | 0 | 00 | 0 |
| 15 | 11 | 0 | 11 | 0 | 00 | 0 | 00 | 0 |
| 16 | 00 | 1 | 00 | 1 | 01 | 0 | 00 | 0 |
| ... | ... | ... | ... | ... | ... | ... | ... | ... |
| 32 | 00 | 1 | 00 | 1 | 10 | 0 | 00 | 0 |
| ... | ... | ... | ... | ... | ... | ... | ... | ... |
| 64 | 00 | 1 | 00 | 1 | 00 | 1 | 01 | 0 |
| ... | ... | ... | ... | ... | ... | ... | ... | ... |
| 128 | 00 | 1 | 00 | 1 | 00 | 1 | 10 | 0 |
| ... | ... | ... | ... | ... | ... | ... | ... | ... |
| 255 | 11 | 0 | 11 | 0 | 11 | 0 | 11 | 0 |

MEMORY MODULE, MEMORY DEVICE AND MEMORY SYSTEM FOR COUNTING NUMBER OF ROW ACCESSES

CROSS-REFERENCE TO RELATED APPLICATIONS

The present application claims the benefit of Korean Patent Application No. 10-2023-0040147, filed on Mar. 28, 2023, which is incorporated herein by reference in its entirety.

BACKGROUND

1. Field

Various embodiments of the present invention relate to a semiconductor design technology, and more particularly, to a memory system and a memory module including a memory device that performs a target refresh operation.

2. Description of the Related Art

Recently, in addition to a normal refresh operation for sequentially refreshing a plurality of word lines, an additional refresh operation which will be, hereinafter, referred to as a ‘target refresh operation’, is being performed on a specific word line that is likely to lose data due to row hammering. The row hammering phenomenon refers to a phenomenon in which data of memory cells coupled to a specific word line or the word lines disposed adjacent to the word line are damaged due to a high number of activations of the corresponding word line. In order to prevent the row hammering phenomenon, a target refresh operation is performed on word lines disposed adjacent to a word line that is activated more than a predetermined number of times which is, hereinafter, referred to as a ‘target word line’.

In order to select a word line to be refreshed during the target refresh operation, the memory device needs to count all addresses inputted with an active command. The memory device has counting circuits to count the number of inputs of the addresses, and as technological scaling progresses, the smaller the size of the memory device, the larger the portion that the counting circuits occupy.

SUMMARY

Embodiments of the present invention are directed to a memory module and a memory system capable of distributing a counting circuit for counting the number of times of activation of each word line to a plurality of memory devices.

According to an embodiment of the present invention, a memory module includes a plurality of memory devices each including a plurality of rows; and a plurality of row counters each configured to count a number of accesses to a corresponding row among the plurality of rows, and each configured to be distributed and disposed in the plurality of memory devices.

According to an embodiment of the present invention, a memory device includes a plurality of rows each accessible by a row address; a counting control circuit configured to activate, according to an active command, a row selection signal corresponding to the row address; and a partial counting circuit configured to: generate a counting signal and a carry output signal by counting, according to the row selection signal, a carry input signal provided through a carry input pad, and provide the carry output signal through a carry output pad.

According to an embodiment of the present invention, a memory system includes a plurality of memory devices each including a plurality of rows each accessible by a row address, and each configured to: generate a counting signal and a carry output signal by counting, according to the row address, a carry input signal provided through a carry input pad, and provide the counting signal through one or more counting pads and the carry output signal through a carry output pad; and a memory controller configured to collect the counting signals from the counting pads to calculate a number of accesses to each of the plurality of rows.

According to an embodiment of the present invention, a memory system includes K number of arrays each including rows of memory cells, corresponding ones of the rows within the individual arrays being commonly accessible according to a single row address, where K is an integer greater than or equal to 1; counters corresponding to the respective rows and each including a K number of accumulators corresponding to the respective arrays; and a connector configured to select, when a selected one of the rows is accessed, a corresponding one of the counters to serially connect the accumulators within the corresponding counter, wherein a foremost one of the serially coupled accumulators is configured to accumulate a number of accesses to the selected row to generate a first pair of a carry signal and a B-bit signal, wherein each of remaining ones of the serially coupled accumulators is configured to accumulate a bit value of the carry signal from a previous one of the serially coupled accumulators to generate a second pair of the carry signal and the B-bit signal, and wherein a combination of the individual B-bit signals is a (K*B)-bit signal representing the accumulated number where B is an integer greater than or equal to 1.

According to embodiments of the present invention, in the memory system, the plurality of memory devices may share a counting circuit that counts the number of times of activation of each word line, thereby minimizing the area occupied by the counting circuit while reducing the row hammer risk.

BRIEF DESCRIPTION OF THE DRAWINGS

FIG. 7 is a table for describing an operation of a memory system in accordance with an embodiment of the present invention.

DETAILED DESCRIPTION

Figure 1A:
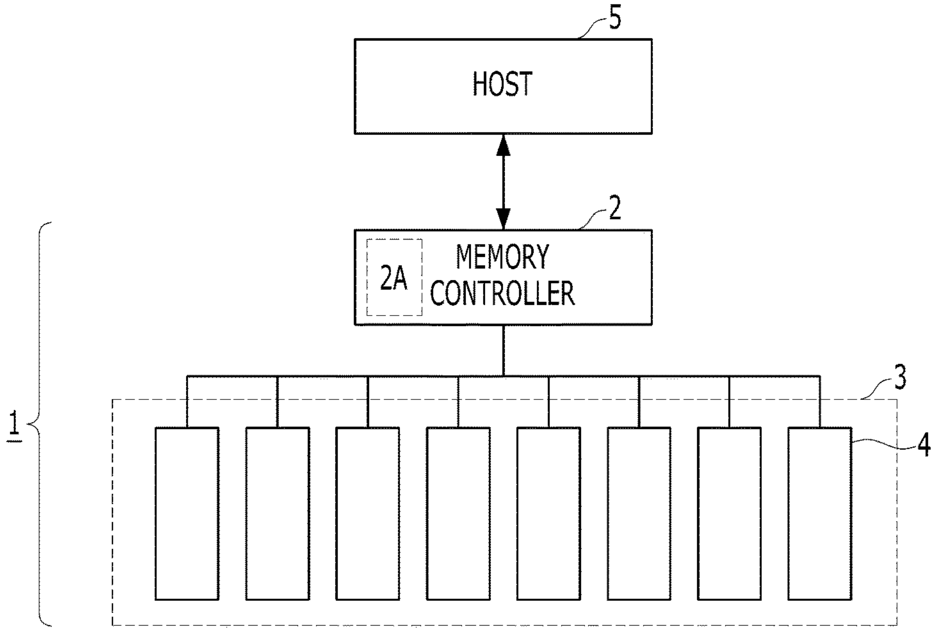
FIGS. 1A and 1B are block diagrams illustrating a known memory system.

Various embodiments of the present disclosure will be described below in more detail with reference to the accompanying drawings. The present disclosure may have embodiments in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present disclosure.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

Figure 1B:
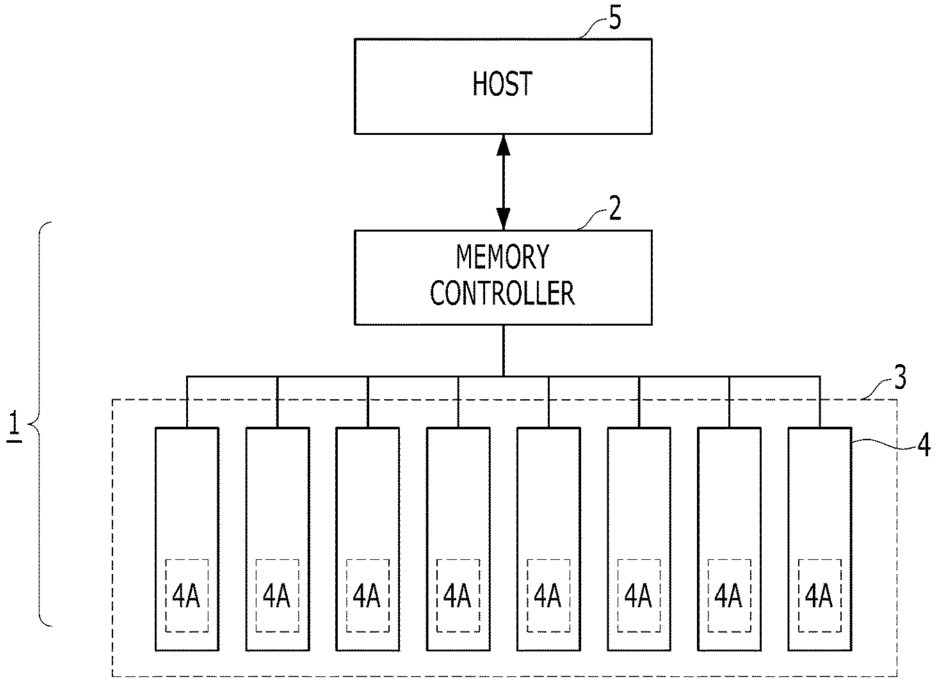

FIGS. 1A and 1B are block diagrams illustrating a memory system 1.

Referring to FIGS. 1A and 1B, the memory system 1 includes a memory controller 2 and a memory module 3.

The memory controller 2 may control an overall operation of the memory module 3 according to a request of a host 5. The memory module 3 may include a plurality of memory devices 4. The memory devices 4 may receive a command and an address in common from the memory controller 2 and respectively exchange data with the memory controller 2.

The memory devices 4 may include a plurality of memory cells coupled between a plurality of word lines (hereinafter referred to as 'rows') and a plurality of bit lines (hereinafter referred to as 'columns'). The memory controller 2 may select a preset number of memory cells by providing a row address for specifying rows of the memory devices 4 and a column address for specifying columns of the memory devices 4. The rows of the memory devices 4 included in one memory module 3 may be selected by the same row address.

Referring to FIG. 1A, the memory controller 2 may include a counting circuit 2A for counting the number of times of activation of each row (or the number of accesses, hereinafter referred to as 'the number of accesses'). The counting circuit 2A may be implemented with a plurality of row counters corresponding to the plurality of rows, respectively. Each of the row counters may generate a counting value by counting the number of inputs of a row address designating a corresponding row. The memory controller 2 may calculate a row hammer address according to the counting values of the counting circuit 2A. For example, the memory controller 2 may select a row address having a maximum value among the counting values as the row hammer address. That is, the row hammer address may indicate a row address frequently accessed or called by the memory controller 2, among the rows of the memory devices 4. The memory controller 2 may provide a refresh command (e.g., a refresh management command) with the row hammer address to the memory devices 4, so that the memory devices 4 may perform a target refresh operation on adjacent rows of a row corresponding to the row hammer address. That is, the memory devices 4 may prevent data damage due to the row hammering phenomenon.

However, as shown in FIG. 1A, when the counting circuit 2A is placed on the memory controller 2, the memory controller 2 needs a counting capacity of (the number of rows)*(the number of bits of each row counter). For example, if 512 rows are deployed and 16-bit row counters are needed to count each row, the counting capacity for 8192 bits is required. Accordingly, the performance of the memory controller 2 may be deteriorated.

Referring to FIG. 1B, each of the memory devices 4 may include a counting circuit 4A for counting the number of accesses to each row. The counting circuit 4A of each of the memory devices 4 may have substantially the same configuration and may be implemented with a plurality of row counters corresponding to the plurality of rows, respectively. Each of the row counters may generate a counting value by counting the number of inputs of a row address designating a corresponding row. The memory controller 2 may select a row address with a maximum value among the counting values provided from the memory devices 4 as a row hammer address. The memory controller 2 may provide a refresh command (e.g., a refresh management command) with the row hammer address to the memory devices 4, so that the memory devices 4 may perform a target refresh operation on adjacent rows of a row corresponding to the row hammer address.

However, as shown in FIG. 1B, when the counting circuit 4A is placed in each of the memory devices 4, the unnecessary area of the memory device (or module) increases due to the counting circuits 4A performing the same counting operation.

Hereinafter, in accordance with an embodiment of the present invention, a method of preventing performance degradation of a memory controller and minimizing an increase in area of a memory device while reducing the row hammer risk will be described.

Figure 2:
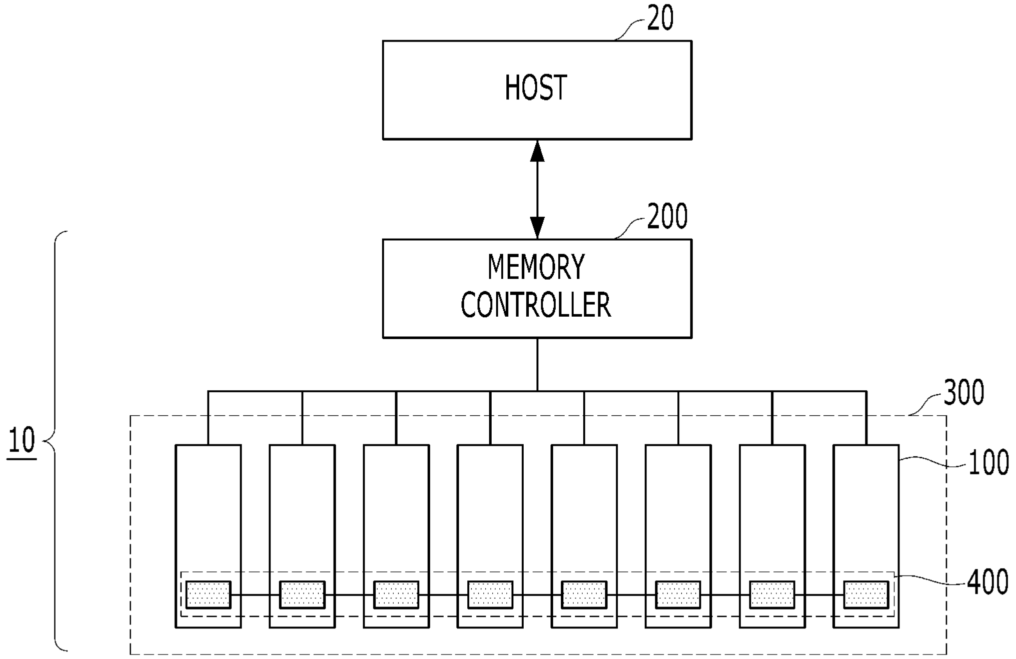
FIG. 2 is a block diagram illustrating a memory system in accordance with an embodiment of the present invention.

FIG. 2 is a block diagram illustrating a memory system 10 in accordance with an embodiment of the present invention.

Referring to FIG. 2, the memory system 10 may store data or read the stored data in response to a request provided from a host 20. The memory system 10 may be used as a main storage device or an auxiliary storage device of the host 20. The memory system 10 may be used as a device to store data under the control of the host 20, such as a mobile phone, a smartphone, an MP3 player, a laptop computer, a desktop computer, a game console, TV, a tablet PC, or an in-vehicle infotainment system.

The host 20 may include an independent and substantial processor, which may be referred to as a core. The host 20 may be implemented with a single processor or a multi-core processor including two or more processors. The host 20 may communicate with the memory system 10 using at least one of various communication standards or interfaces such as, for example, Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe of PCI-e), Non-Volatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The memory system may include a memory controller 200 and at least one memory module 300.

The memory controller 200 may control an overall operation of the memory module 300 by generating a command and an address and providing them to the memory module 300, according to a request of the host 20. For example, the memory controller 200 may provide data provided from the host 20 to the memory module 300 during a write operation. The memory controller 200 may provide data read from the memory module 300 to the host 20 during a read operation. The memory controller 200 may be implemented in the host 20, so as to access the memory module 300 according to a request of a processor (not shown) inside the host 20. For example, the memory controller 200 may access the memory module 300 in a direct memory access (DMA) manner. The memory controller 200 may issue a command and an address defined in a specification of the memory module 300 to the memory module 300.

The memory module 300 may operate as a buffer memory, a working memory, and a main memory for the host 20. The memory module 300 may operate according to the command and the address issued by the memory controller 200. The memory module 300 may store data transmitted from the memory controller 200 or transmit data to the memory controller 200. The memory module 300 may be one of DIMM (dual-inline memory module), RDIMM (registered DIMM), LRDIMM (load reduced DIMM), and NVDIMM (non-volatile DIMM). According to an embodiment, the memory module 300 may further include a module controller or a register clock driver, and data buffers. According to an embodiment, the memory controller 200 may include a module controller or a register clock driver, and a configuration corresponding to data buffers.

The memory module 300 may include one or more memory devices 100. The memory devices 100 may include a plurality of memory cells coupled between a plurality of rows and a plurality of columns. The memory controller 200 may select a preset number of memory cells by providing a row address for specifying the rows of the memory devices 100 and a column address for specifying the columns to the memory devices 100. The rows of the memory devices 100 included in one memory module 300 may be selected by the same row address. That is, the rows of the memory devices 100 may be accessible by the same row address.

Each of the memory devices 100 may perform an active operation, a precharge operation, a refresh operation, a read operation, or a write operation on the memory cells according to the command, the address, and/or the data provided from the memory controller 200. Each of the memory device 100 may also be referred to as a memory chip. The memory devices 100 included in the same memory module 300 may have different data input/output paths while receiving the command and the address in common. Depending on an embodiment, each of the memory devices 100 may be a DRAM (Dynamic Random Access Memory) such as DDR SDRAM (Double Data Rate Synchronous Dynamic Random Access Memory), LPDDR (Low Power Double Data Rate) SDRAM, GDDR (Graphics Double Data Rate) SDRAM, RDRAM (Rambus Dynamic Random Access Memory) and the like. According to an embodiment, the memory devices 100 may be configured with different types of memories. Hereinafter, the memory devices 100 are DRAM devices that support a double data rate (DDR) interface.

In an embodiment of the present invention, the memory devices 100 may share a counting circuit 400 for counting the number of accesses to each row. The counting circuit 400 may be implemented with a plurality of row counters respectively corresponding to the plurality of rows. Each of the row counters may count the number of accesses to a corresponding row by counting the number of inputs of a row address designating the corresponding row. In particular, in the embodiment of the present invention, each of the row counters of the counting circuit 400 may be distributed and disposed in the memory devices 100. For example, when 8 memory devices 100 are deployed and the counting circuit 400 includes 16-bit row counters, each 16-bit row counter may be distributed and disposed by 2 bits in the 8 memory devices 100. Accordingly, each 16-bit row counter may generate a 16-bit counting signal. When each 16-bit row counter is distributed and disposed by 2 bits in the 8 memory devices 100, 8 number of 2-bit adders may be disposed respectively in the 8 memory devices 100 and may configure the 16-bit row counter, which will be described below.

The memory controller 200 may select a row address with a maximum value among the counting signals provided from the 16-bit row counters of the memory devices 100 as a row hammer address. The memory controller 200 provides a refresh command (e.g., a refresh management command) along with the row hammer address to the memory devices 100, so that the memory devices 100 may perform a target refresh operation on adjacent rows of a row corresponding to the row hammer address.

As described above, in the embodiment of the present invention, the memory devices 100 may share the counting circuit 400 for counting the number of accesses to rows, thereby preventing the performance degradation of the memory controller and minimizing the area of the memory devices while reducing the row hammer risk.

Hereinafter, a detailed configuration of the memory system 10 of the present invention will be described.

Figure 3:
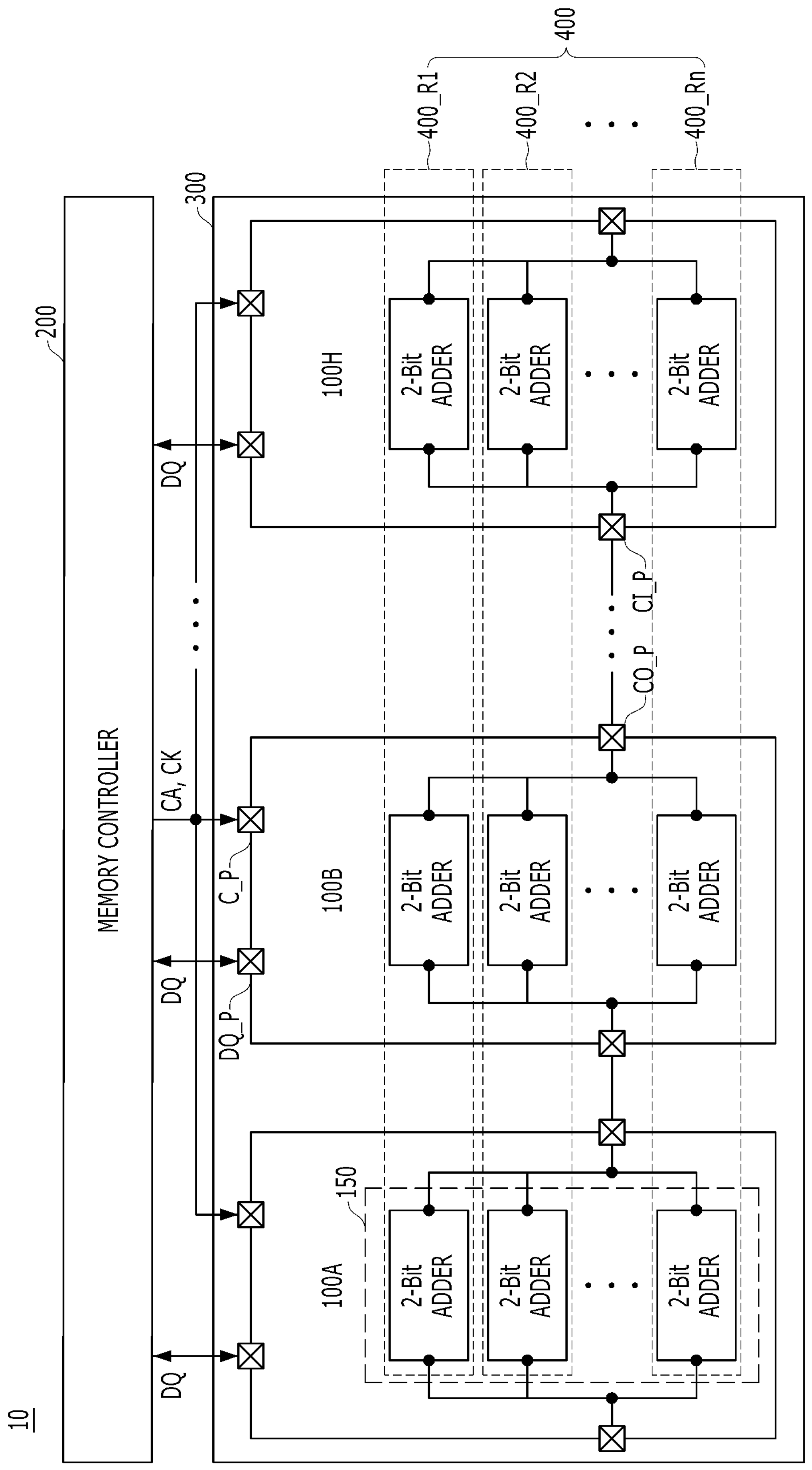
FIG. 3 is a detailed configuration diagram illustrating a memory system in accordance with a first embodiment of the present invention.

FIG. 3 is a detailed configuration diagram illustrating the memory system 10 in accordance with a first embodiment of the present invention. In FIG. 3, a case in which first to eighth memory devices 100A to 100H are disposed in one memory module 300 is illustrated.

Referring to FIG. 3, the memory controller 200 may generate a command/address signal CA corresponding to a request of the host 20, and provide the command/address signal CA to the first to eighth memory devices 100A to 100H. The memory controller 200 may provide a clock signal CK with the command/address signal CA to the first to eighth memory devices 100A to 100H. The memory controller 200 may respectively provide data DQ to the first to eighth memory devices 100A to 100H or provide the data DQ to the host 20 by respectively receiving the data DQ read from the first to eighth memory devices 100A to 100H. As described above, the first to eighth memory devices 100A to 100H included in the same memory module 300 may receive the command/address signal CA and the clock signal CK in common, while independently receiving the data DQ through different input/output paths.

The first to eighth memory devices 100A to 100H may perform a write (or a program) operation, a read operation and the like, according to the command/address signal CA and/or the data DQ provided from the memory controller 200. The first to eighth memory devices 100A to 100H may receive the command/address signal CA and the clock signal CK through control pads C_P, respectively, and input and output the data DQ through data pads DQ_P. In FIG. 3, the control pads C_P and the data pads DQ_P are each illustrated as one pad, but the control pads C_P and the data pads DQ_P may be provided in a number corresponding to the number of bits of the command/address signal CA and the data DQ, respectively.

In an embodiment of the present invention, the first to eighth memory devices 100A to 100H may share the counting circuit 400 for counting the number of accesses to each row. The counting circuit 400 may include first to n-th row counters 400_R1 to 400_Rn respectively corresponding to n rows (e.g., first to n-th rows R1 to Rn). Each of the first to n-th row counters 400_R1 to 400_Rn may be distributed and disposed in the first to eighth memory devices 100A to 100H. For example, when each of the first to n-th row counter 400_R1 to 400_Rn is a 16-bit counter, the first row counter 400_R1 is distributed and disposed by m/k bits (i.e., 16/8=2, where m is the number of bits of each row counter, and k is the number of the memory devices) in the first to eighth memory devices 100A to 100H, the second row counter 400_R2 is distributed and disposed by 2 bits in the first to eighth memory devices 100A to 100H, and in this way, the n-th row counter 400_Rn is distributed and disposed by 2 bits in the first to eighth memory devices 100A to 100H. The number of bits of each row counter means a maximum bit-capacity of the row counter that can represent a counted number. When the counted number becomes greater than the maximum bit-capacity, the row counter may initialize the counted number while generating a carry signal or changing a bit value of the carry signal.

According to an embodiment, each of the first to n-th row counters 400_R1 to 400_Rn may include a plurality of m/k-bit adders. For example, the first row counter 400_R1 may include eight 2-bit adders respectively placed in the first to eighth memory devices 100A to 100H, the second row counter 400_R2 may include eight 2-bit adders respectively placed in the first to eighth memory devices 100A to 100H, and the n-th row counter 400_Rn may include eight 2-bit adders respectively placed in the first to eighth memory devices 100A to 100H. Preferably, each adder may be implemented with a full-adder for outputting a counting signal and its own carry signal by accumulating a carry signal of a previous stage.

In an embodiment of the present invention, each of the first to eighth memory devices 100A to 100H may further include a carry input pad CI_P and a carry output pad CO_P. Among the first to eighth memory devices 100A to 100H, the carry input pad CI_P of each memory device may be coupled to the carry output pad CO_P of a memory device at a previous stage, and the carry output pad CO_P of each memory device may be coupled to the carry input pad CI_P of a memory device at a next stage. Accordingly, the first to eighth memory devices 100A to 100H may form a cascade structure connected to each other through the carry input pads CI_P and the carry output pads CO_P.

The adders placed in each of the first to eighth memory devices 100A to 100H may configure a partial counting circuit 150. That is, the counting circuit 400 may be configured by partial counting circuits 150 of all memory devices 100A to 100H. The configuration of the partial counting circuit 150 will be described in FIGS. 4 to 6.

The adders placed in each of the first to eighth memory devices 100A to 100H may be coupled in parallel between the carry input pad CI_P and the carry output pad CO_P of the memory device. On the other hand, the adders included in each of the first to n-th row counters 400_R1 to 400_Rn may be coupled in series through the carry input pads CI_P and the carry output pads CO_P of the first to eighth memory devices 100A to 100H.

The first to eighth memory devices 100A to 100H may select one of the first to n-th row counters 400_R1 to 400_Rn based on the command/address signal CA and the clock signal CK. For example, the first to eighth memory devices 100A to 100H may select one of the first to n-th row counters 400_R1 to 400_Rn according to a row address when an active command is entered. Each adder of the selected row counter may sequentially receive through a carry input pad CI_P a carry signal provided from an adder disposed in a memory device at a previous stage among the first to eighth memory devices 100A to 100H, and provide through a carry output pad CO_P its carry signal to an adder disposed in a memory device at a next stage among the first to eighth memory devices 100A to 100H. Accordingly, each of the carry input pad CI_P and the carry output pad CO_P may be a single pad that sequentially transmits the carry signal of the selected row counter. For reference, each adder accumulates the carry signal from the previous stage and outputs a counting signal and its own carry signal, so it can serve as a partial counter for counting the carry signal from the previous stage.

Since there are no signals provided to the adders of the first memory device 100A placed at a front end of the first to eighth memory devices 100A to 100H, a signal corresponding to the active command may be input to the adders through the carry input pad CI_P.

Hereinafter, a detailed configuration of the first to eighth memory devices 100A to 100H will be described with reference to the drawings. Since the first to eighth memory devices 100A to 100H have substantially the same configuration, the first memory device 100A is described as an example.

Figure 4:
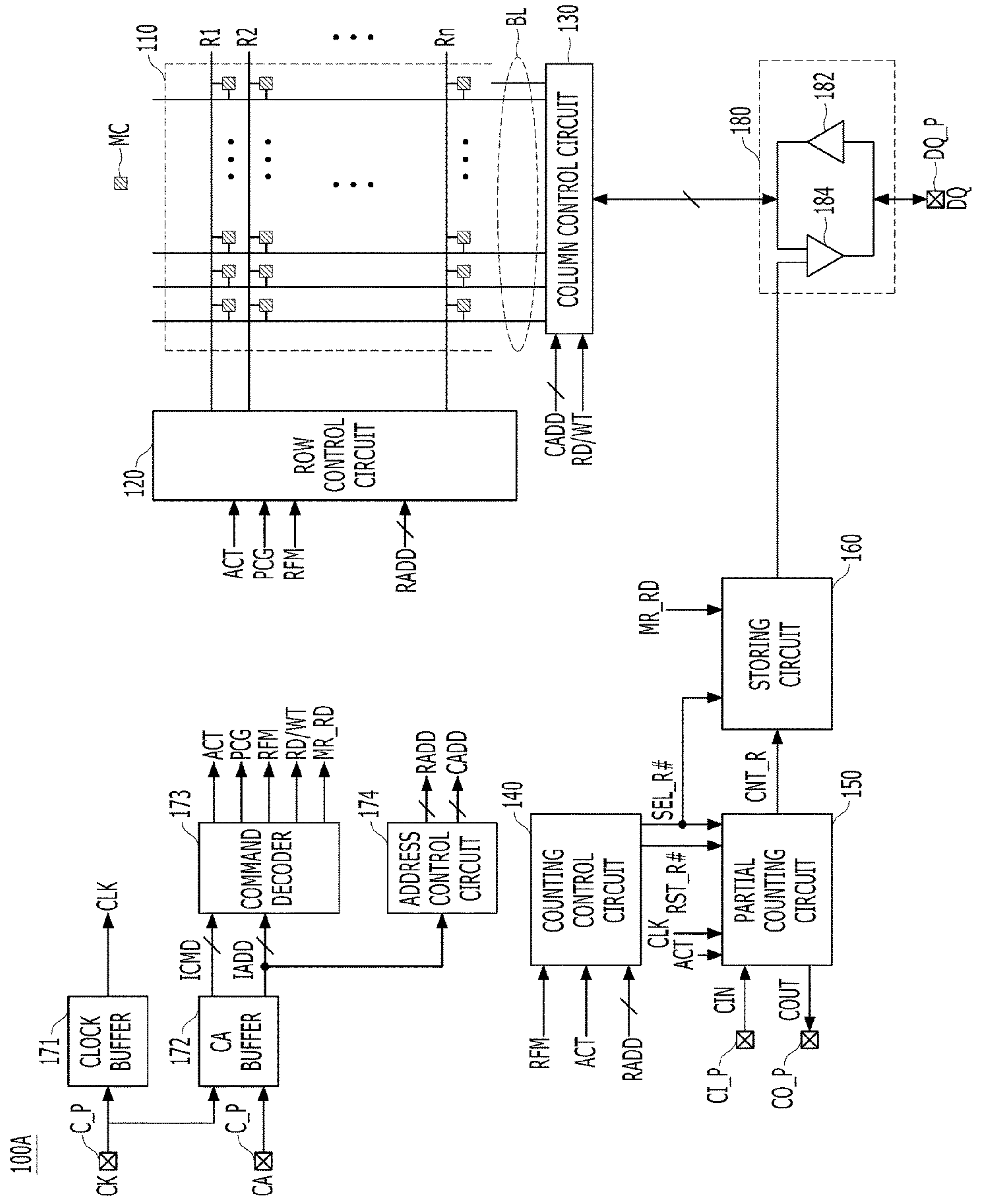
FIG. 4 is a detailed configuration diagram illustrating a memory device of FIG. 3.

FIG. 4 is a detailed configuration diagram illustrating the first memory device 100A of FIG. 3.

Referring to FIG. 4, the first memory device 100A may include a memory cell region 110, a row control circuit 120, a column control circuit 130, a counting control circuit 140, a partial counting circuit 150, a storing circuit 160, a clock buffer 171, a command/address (CA) buffer 172, a command decoder 173, an address control circuit 174, and a data input/output circuit 180.

The memory cell region 110 may include a plurality of memory cells MC coupled to a plurality of rows R1 to Rn and a plurality of columns BL. The memory cell region 110 may be composed of at least one bank. The number of banks or the number of memory cells MC may be determined depending on the capacity of the memory device 100.

The clock buffer 171 may receive the clock signal CK from the memory controller 200 through the control pads C_P. The clock buffer 171 may generate an internal clock signal CLK by buffering the clock signal CK. Depending on an embodiment, the memory controller 200 may transfer system clocks to the first memory device 100A in a differential manner, and the first memory device 100A may include clock buffers that receive the differential clocks, respectively.

The CA buffer 172 may receive the command/address signal C/A from the memory controller 200 through the control pads C_P based on the clock signal CK. The CA buffer 172 may sample the command/address signal C/A based on the clock signal CK and output an internal command ICMD and an internal address IADD. Consequently, the first memory device 100A may be synchronized with the clock signal CK.

The command decoder 173 may decode the internal command ICMD which is output from the CA buffer 172 to generate an active command ACT, a precharge command PCG, a refresh management command RFM, a read/write command RD/WT, and an output control command MR_RD. Although not illustrated, the command decoder 173 may additionally generate an auto-refresh command for a normal refresh operation, or a target refresh command for a target refresh operation, by decoding the internal command ICMD.

The address control circuit 174 may classify the internal address IADD received from the CA buffer 172 as a row address RADD or a column address CADD. Depending on an embodiment, the address control circuit 174 may classify some bits of the internal address IADD as a row address RADD and classify the remaining bits as a column address CADD. The address control circuit 174 may classify the internal address IADD as a row address RADD when an active operation is directed as a result of the decoding by the command decoder 173, and may classify the internal address IADD as a column address CADD when a read or write operation is directed. The plurality of rows R1 to Rn may be accessed by the row address RADD, and the columns BL may be accessed by the column address CADD.

The row control circuit 120 may be coupled to the memory cell region 110 through the rows R1 to Rn. The row control circuit 120 may perform an active operation of activating a row selected by the row address RADD according to the active command ACT, and perform a precharge operation of precharging the selected row according to the precharge command PCG. The row control circuit 120 may perform a refresh operation on adjacent rows of a row corresponding to the row address RADD according to the refresh management command RFM.

The column control circuit 130 may be coupled to the memory cell region 110 through the columns BL. The column control circuit 130 may select a predetermined number of the columns BL corresponding to the column address CADD. The column control circuit 130 may read data from the memory cell region 110 through the selected columns BL according to the read command RD, and write the data DQ provided from the memory controller 200 into the memory cell region 110 through the selected columns BL according to the write command WT.

The data input/output circuit 180 may be coupled between the column control circuit 130 and the data pads DQ_P to transmit and receive the data DQ with the memory controller 200. The data input/output circuit 180 may include a data input circuit 182 and a data output circuit 184. The data input circuit 182 may receive the data DQ from the memory controller 200 through the data pads DQ_P. The data output circuit 184 may output the data DQ read from the memory cell region 110 through the data pads DQ_P.

The counting control circuit 140 may generate a plurality of row selection signals SEL_R #(where #is an integer from 1 to n) corresponding to the rows R1 to Rn, respectively, by decoding the row address RADD according to the active command ACT. The counting control circuit 140 may activate a row selection signal corresponding to the row address RADD according to the active command ACT. In addition, the counter control circuit 140 may generate a plurality of row reset signals RST_R #corresponding to the rows R1 to Rn, respectively, by decoding the row address RADD according to the refresh management command RFM. The counting control circuit 140 may activate a row reset signal corresponding to the row address RADD according to the refresh management command RFM.

The partial counting circuit 150 may receive a carry input signal CIN through a carry input pad CI_P, which is a carry signal input from a memory device at a previous stage among the first to eighth memory devices 100A to 100H. The partial counting circuit 150 may generate a counting signal CNT_R and a carry output signal COUT by counting the carry input signal CIN according to an activated one among the row selection signals SEL_R #. As described in FIG. 3, when the row counters are distributed and disposed in each memory device by 2 bits, the counting signal CNT_R may be a 2-bit signal. On the other hand, the carry input signal CIN and the carry output signal COUT may be a 1-bit signal. The partial counting circuit 150 may provide, through the carry output pad CO_P, a memory device at a next stage with the carry output signal COUT as a carry signal. The partial counting circuit 150 may initialize the counting signal CNT_R according to the activated one among the row reset signals RST_R #. The partial counting circuit 150 may additionally receive the active command ACT and the internal clock signal CLK.

The storing circuit 160 may store the counting signal CNT_R generated by the partial counting circuit 150 according to the row selection signals SEL_R #. The storing circuit 160 may output a signal stored therein in response to the output control command MR_RD. The storing circuit 160 may provide the stored signal to the data output circuit 184 in response to the output control command MR_RD, and the data output circuit 184 may output the stored signal to the memory controller 200 through the data pads DQ_P. Depending on an embodiment, the storing circuit 160 may be implemented with a known mode register and may provide the stored signal to the data output circuit 184 in response to a mode register read command (MRR).

Figure 5:
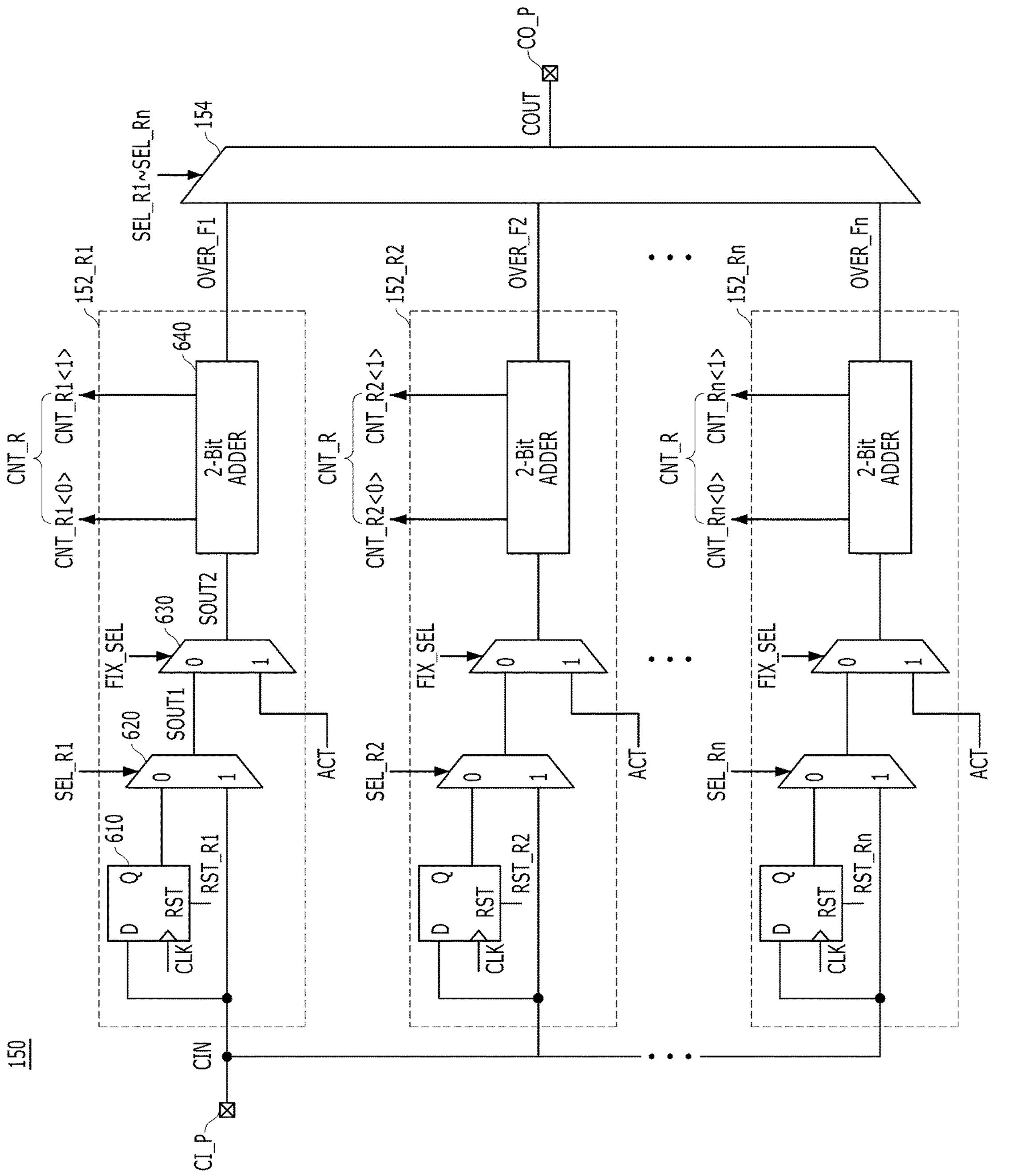
FIG. 5 is a detailed configuration diagram illustrating a partial counting circuit of FIG. 4.
Figure 6:
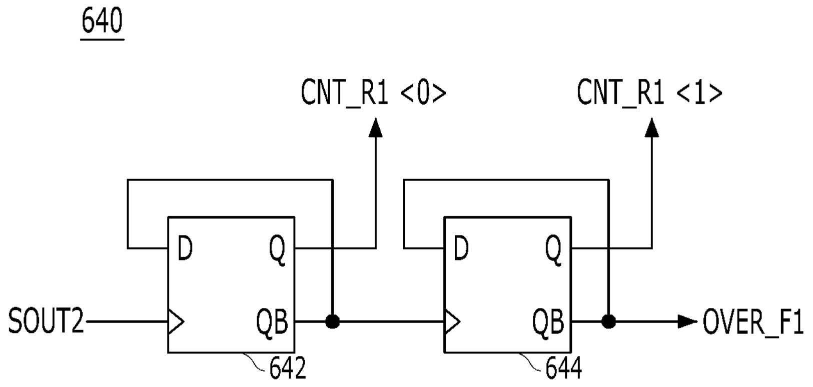
FIG. 6 is a circuit diagram illustrating an adder of FIG. 5.

FIG. 5 is a detailed configuration diagram illustrating the partial counting circuit 150 of FIG. 4. FIG. 6 is a circuit diagram illustrating a 2-bit adder 640 of FIG. 5.

Referring to FIG. 5, the partial counting circuit 150 may include first to n-th partial row counters 152_R1 to 152_Rn and an output selection circuit 154.

The first to n-th partial row counters 152_R1 to 152_Rn may respectively correspond to the rows R1 to Rn and may be coupled in common to the carry input pad CI_P to receive the carry input signal CIN. The first to n-th partial row counters 152_R1 to 152_Rn may generate the counting signal CNT_R by counting the carry input signal CIN according to the row selection signals SEL_R1 to SEL_Rn. In FIG. 5, 2-bit counting signals CNT_R #<1:0> output from the first to n-th partial row counters 152_R1 to 152_Rn may correspond to the counting signal CNT_R of FIG. 4.

The first to n-th partial row counters 152_R1 to 152_Rn may generate a plurality of overflow signals OVER_F1 to OVER_Fn when the counting signal CNT_R #<1:0> is fully counted. For example, the first to n-th partial row counters 152_R1 to 152_Rn may generate the overflow signals OVER_F1 to OVER_Fn when the carry input signal CIN is re-entered in a state that the 2-bit counting signal CNT_R #<1:0> is fully counted to "11". In addition, the first to n-th partial row counters 152_R1 to 152_Rn may reset the counting signal CNT_R #<1:0> according to the row reset signals RST_R1 to RST_Rn.

The output selection circuit 154 may output the carry output signal COUT by selecting one of the overflow signals OVER_F1 to OVER_Fn according to the activated one among the row selection signals SEL_R1 to SEL_Rn. The carry output signal COUT from the output selection circuit 154 may be provided to the memory device at the next stage through the carry output pad CO_P.

The first to n-th partial row counters 152_R1 to 152_Rn have substantially the same configuration, so the first partial row counter 152_R1 will be described as an example.

The first partial row counter 152_R1 may include a previous carry storage 610, a first input selector 620, a second input selector 630, and a 2-bit adder 640.

The previous carry storage 610 may store the carry input signal CIN according to the internal clock signal CLK. The previous carry storage 610 may initialize the stored signal according to the row reset signal RST_R1. The previous carry storage 610 may be provided to store the previous carry input signal when a corresponding partial row counter (i.e., the first partial row counter 152_R1) is not selected.

The first input selector 620 may output a first selection signal SOUT1 by selecting the carry input signal CIN or the stored signal in the previous carry storage 610 according to the row selection signal SEL_R1.

The second input selector 630 may output a second selection signal SOUT2 by selecting the first selection signal SOUT1 or the active command ACT according to a frontmost selection signal FIX_SEL. For reference, a frontmost selection signal FIX_SEL is a signal for selecting the first memory device 100A placed at the front end of the memory devices 100A to 100H, which are logically or physically disposed in series. The frontmost selection signal FIX_SEL may be fixed at a specific logic level for each of the memory devices 100A to 100H. For example, only the frontmost selection signal FIX_SEL of the first memory device 100A disposed at the front end may be fixed at a logic high level, and the frontmost selection signals FIX_SEL of the remaining memory devices 100B to 100H may be fixed at a logic low level. Accordingly, the second input selector 630 of the first memory device 100A may always select the active command ACT and output the active command as the second selection signal SOUT2. Depending on the embodiment, the second input selector 630 may be omitted, or disposed only on the first memory device 100A disposed at the front end.

The 2-bit adder 640 may generate the 2-bit counting signal CNT_R1<1:0> and the overflow signal OVER_F1 by accumulating the second selection signal SOUT2. Preferably, the 2-bit adder 640 may be implemented with a full-address.

For example, referring to FIG. 6, the 2-bit adder 640 may include a first flip-flop 642 and a second flip-flop 644 coupled in series. Preferably, the first flip-flop 642 and the second flip-flop 644 may be composed of D flip-flops. The first flip-flop 642 may receive the second selection signal SOUT2 through a clock terminal thereof and may output a first bit CNT_R1<0> of the counting signal through an output terminal Q thereof. Inverted output terminal QB and input terminal D of the first flip-flop 642 may be coupled to each other. The second flip-flop 644 may receive, through a clock terminal thereof, the signal from the inverted output terminal QB of the first flip-flop 642 and may output a second bit CNT_R1<1> of the counting signal through an output terminal Q thereof. Inverted output terminal QB and input terminal D of the second flip-flop 644 may be coupled to each other. The signal from the inverted output terminal QB of the second flip-flop 644 may be the overflow signal OVER_F1.

With the above configuration, the 2-bit adder 640 may sequentially increase a value of the counting signal CNT_R1<1:0> whenever the second selection signal SOUT2 is input. The 2-bit adder 640 may output the overflow signal OVER_F1 when the second selection signal SOUT2 is input in a state that the counting signal CNT_R1<1:0> is fully counted to "11". Since the 2-bit adder 640 shown in FIG. 6 serves to count the second selection signal SOUT2 in an asynchronous manner, it can also be defined as an asynchronous counter.

Hereinafter, referring to FIGS. 3 to 7, an operation of the memory system 10 according to an embodiment of the present invention will be described.

FIG. 7 is a table for describing an operation of the memory system 10 in accordance with an embodiment of the present invention. For convenience of description, in the table of FIG. 7, a case where the counting circuit 400 is distributed in first to fourth memory devices 100A to 100D and 8-bit row counters are arranged for each row, will be described as an example.

Referring to FIG. 7, when the row address RADD is provided from the memory controller 200 with the first active command ACT for the first row R1, the counting control circuit 140 of each of the first to fourth memory device 100A to 100D may activate the first row selection signal SEL_R1. Accordingly, the first partial row counter 152_R1 of the partial counting circuit 150 of each of the first to fourth memory devices 100A to 100D may be selected. As a result, the first row counter 400_R1 of the counting circuit 400 of FIG. 3 may be operated.

According to the frontmost selection signal FIX_SEL, the first partial row counter 152_R1 of the first memory device 100A may count the active command ACT to generate the counting signal CNT_R1<1:0> of "01" and the carry output signal COUT of "0". In this case, based on the carry output signal COUT of "0", the remaining memory devices 100B to 100D may output the counting signal CNT_R1<1:0> of "00".

After that, even if the active command ACT for another row is input, the first partial row counter 152_R1 may maintain its counting value by storing, in the previous carry storage 610, the carry input signal CIN provided from the memory device at the previous stage among the first to fourth memory devices 100A to 100D.

When the active command ACT for the first row R1 is input 4 times, the first partial row counter 152_R1 of the first memory device 100A may generate the counting signal CNT_R1<1:0> of "00" and the carry output signal COUT of "1". Based on the carry output signal COUT of "1", the second memory device 100B at the next stage may generate the counting signal CNT_R1<1:0> of "01" and the carry output signal COUT of "0".

When the active command ACT for the first row R1 is input 16 times, each the first partial row counter 152_R1 of the first and second memory devices 100A and 100B may generate the counting signal CNT_R1<1:0> of "00" and the carry output signal COUT of "1". Based on the carry output signal COUT of "1", the third memory device 100C at the next stage may generate the counting signal CNT_R1<1:0> of "01" and the carry output signal COUT of "0".

When the active command ACT for the first row R1 is input 64 times, each first partial row counter 152_R1 of the first to third memory devices 100A to 100C may generate the counting signal CNT_R1<1:0> of "00" and the carry output signal COUT of "1". Based on the carry output signal COUT of "1", the fourth memory device 100D at the next stage may generate the counting signal CNT_R1<1:0> of "01" and the carry output signal COUT of "0".

In this way, whenever the active command ACT for the first row R1 is input, the adders of the first row counter 400_R1, which are coupled in series, may generate the counting signals CNT_R1<1:0> that increase by "+1". The generated counting signals CNT_R1<1:0> may be stored in the storing circuit 160 of each of the first to fourth memory devices 100A to 100D.

Through the above process, the number of accesses to each row R1 to Rn may be stored, as a 2-bit value, in the storage circuit 160 of each memory device 100A to 100D. When the output control command MR_RD is provided from the memory controller 200, the storing circuit 160 of each memory device 100A to 100D may output the stored 2-bit value to the memory controller 200 through the data pads DQ_P.

The memory controller 200 may collect the counting signals or the 2-bit values provided from the first to fourth memory devices 100A to 100D and calculate the number of accesses for each row R1 to Rn by collecting the 2-bit values. For example, for each row, the memory controller 200 may calculate a counting value by collecting, as least significant bits, the 2-bit value from the first memory device 100A and collecting, as most significant bits, the 2-bit value from the fourth memory device 100D. The memory controller 200 may select a row address having a maximum value among the counting values as a row hammer address.

The memory controller 200 may provide the refresh management command RFM along with the row hammer address to the first to fourth memory devices 100A to 100D in the form of the command/address signal CA. The row control circuit 120 of the first to fourth memory devices 100A to 100D may perform a target refresh operation on adjacent rows of a row corresponding to the row address RADD (i.e., the row hammer address) according to the refresh management command RFM. The counting control circuit 140 of the first to fourth memory devices 100A to 100D may activate a row reset signal corresponding to the row address RADD according to the refresh management command RFM, and the partial counting circuit 150 may initialize a counting signal of a corresponding partial row counter according to the activated row reset signal.

Moreover, in the first embodiment, it is described that the counting circuit 400 provides the counting signal CNT_R to the memory controller 200 through the data pads DQ_P, but the present invention is not limited thereto. Hereinafter, a case where the counting circuit 400 provides the counting signal CNT_R to the memory controller 200 using separate pads will be described.

Figure 8:
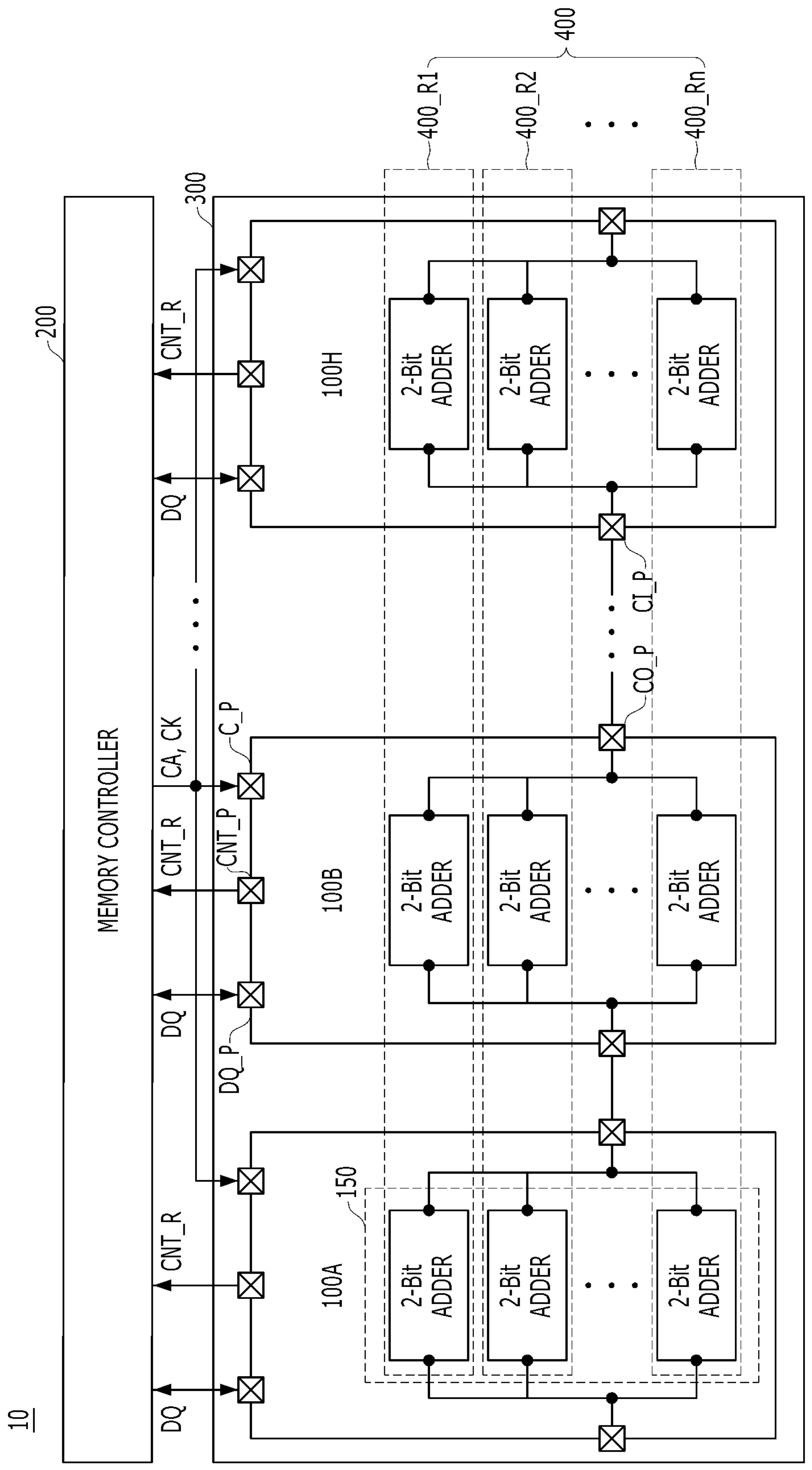
FIG. 8 is a detailed configuration diagram illustrating a memory system in accordance with a second embodiment of the present invention.

FIG. 8 is a detailed configuration diagram illustrating the memory system 10 in accordance with a second embodiment of the present invention.

Referring to FIG. 8, the memory system 10 may include a memory controller 200 and a plurality of memory devices 100A to 100H. The memory system 10 of FIG. 8 is substantially the same as the memory system 10 of FIG. 3, except that one or more counting pads CNT_P for transmitting a counting signal CNT_R between the memory controller 200 and the memory devices 100A to 100H are additionally placed in each memory device 100A to 100H. That is, the memory devices 100A to 100H of FIG. 8 may receive a command/address signal CA and a clock signal CK from the memory controller 200 through control pads C_P, input and output data DQ through data pads DQ_P, and output the counting signal CNT_R to the memory 200 through the counting pads CNT_P. The number of the counting pads CNT_P may be adjusted according to the number of bits of the counting signal CNT_R.

Figure 9:
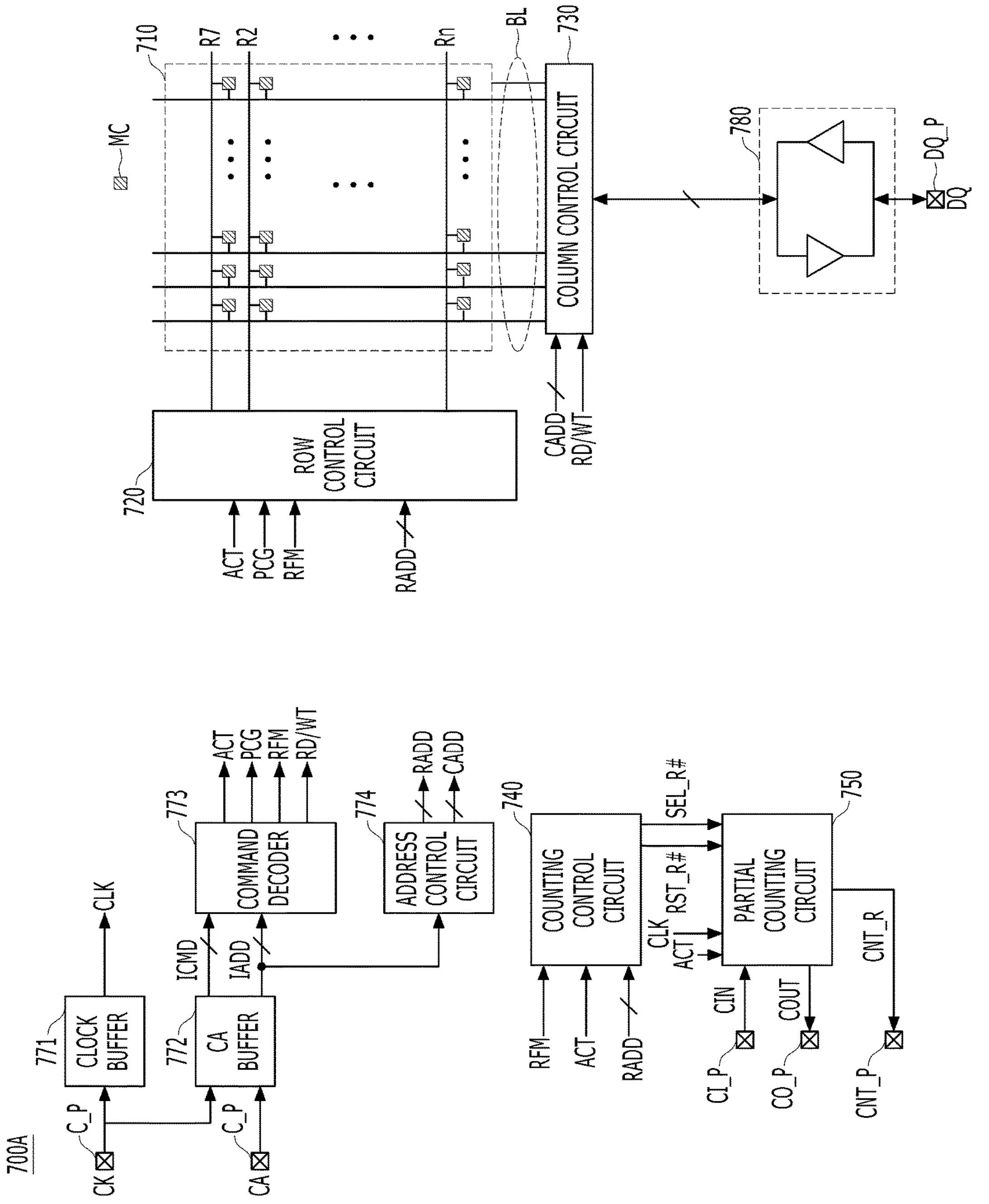
FIG. 9 is a detailed configuration diagram illustrating a memory device of FIG. 8.

FIG. 9 is a detailed configuration diagram illustrating the first memory device 100A of FIG. 8.

Referring to FIG. 9, the first memory device 100A may include a memory cell region 710, a row control circuit 720, a column control circuit 730, a counting control circuit 740, a partial counting circuit 750, a clock buffer 771, a command/address (CA) buffer 772, a command decoder 773, an address control circuit 774, and a data input/output circuit 780. The configurations of FIG. 9 are substantially the same as those of FIG. 3.

However, the first memory device 100A of FIG. 9 may omit the storage circuit from the first memory device 100A of FIG. 3, and the partial counting circuit 750 may output the counting signal CNT_R to the memory controller 200 through one or more counting pads CNT_P instead of storing the counting signal CNT_R. Depending on an embodiment, a configuration for latching the counting signal CNT_R output through the counting pads CNT_P may be added.

As described above, according to the embodiments of the present invention, the memory devices 100 may reduce the row hammer risk while minimizing the area occupied by sharing the counting circuit for counting the number of accesses to each row.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal.

What is claimed is:

1. A memory device, comprising:

a plurality of rows each accessible by a row address;

a counting control circuit configured to activate, according to an active command, a row selection signal corresponding to the row address; and a partial counting circuit configured to:

generate a counting signal and a carry output signal by counting, according to the row selection signal, a carry input signal provided through a carry input pad, and provide the carry output signal through a carry output pad, wherein each of the carry input pad and the carry output pad is a single pad.

2. The memory device of claim 1, further comprising:

a storing circuit configured to store the counting signal according to the row selection signal; and a data input/output circuit configured to output a signal stored in the storing circuit through data pads.

3. The memory device of claim 1, further comprising one or more counting pads configured to output the counting signal.

4. The memory device of claim 1, wherein the counting control circuit is further configured to activate, according to a refresh management command, a row reset signal corresponding to the row address, and wherein the partial counting circuit is further configured to initialize the counting signal according to the row reset signal.

5. The memory device of claim 1, wherein the partial counting circuit includes:

a plurality of partial row counters respectively corresponding to the plurality of rows and coupled in common to the carry input pad, wherein each partial row counter is configured to:

generate the counting signal by counting the carry input signal according to the row selection signal, and output an overflow signal when the counting signal is fully counted; and an output selection circuit configured to output the carry output signal by selecting, according to the row selection signal, one of the overflow signals from the plurality of partial row counters.

6. The memory device of claim 5, wherein each of the plurality of partial row counters includes:

a previous carry storage configured to store the carry input signal according to an internal clock signal;

a first input selector configured to output a first selection signal by selecting, according to the row selection signal, the carry input signal or a signal stored in the previous carry storage;

a second input selector configured to output a second selection signal by selecting, according to a frontmost selection signal, the first selection signal or the active command; and an adder configured to generate the counting signal and the overflow signal by accumulating the second selection signal.

7. The memory device of claim 6, wherein the adder includes:

a first flip-flop configured to receive the second selection signal through a clock terminal thereof and output a first bit of the counting signal through an output terminal thereof, an inverted output terminal and an input terminal thereof being coupled to each other; and a second flip-flop configured to receive the signal from the inverted output terminal of the first flip-flop through a clock terminal thereof and output a second bit of the counting signal through an output terminal thereof, and wherein an inverted output terminal and an input terminal thereof being coupled to each other.

8. A memory device, comprising:

a plurality of rows each accessible by a row address;

a counting control circuit configured to activate, according to an active command, a row selection signal corresponding to the row address, and to activate, according to a refresh management command, a row reset signal corresponding to the row address, and a partial counting circuit configured to generate a counting signal and a carry output signal by counting, according to the row selection signal, a carry input signal provided through a carry input pad, provide the carry output signal through a carry output pad, wherein each of the carry input pad and the carry output pad is a single pad, and initialize the counting signal according to the row reset signal.

* * * * *